US011783990B1

(12) United States Patent
Hoen et al.

(10) Patent No.: US 11,783,990 B1
(45) Date of Patent: Oct. 10, 2023

(54) TAPERED MULTIPATH INDUCTORS

(71) Applicant: NXP B.V., Eindhoven (NL)

(72) Inventors: Thomas Jan Hoen, Hardenberg (NL); Yanyu Jin, Eindhoven (NL); Anne Johan Annema, Hengelo (NL); Jos Verlinden, Wachtendonk (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/657,173

(22) Filed: Mar. 30, 2022

(51) Int. Cl.
*H01F 27/28* (2006.01)
*H03B 5/12* (2006.01)
*H01F 27/29* (2006.01)
*H01F 17/00* (2006.01)
*H01L 49/02* (2006.01)

(52) U.S. Cl.
CPC ..... *H01F 27/2804* (2013.01); *H01F 17/0006* (2013.01); *H01F 27/29* (2013.01); *H01L 28/10* (2013.01); *H03B 5/12* (2013.01); *H01F 2017/0046* (2013.01); *H01F 2017/0073* (2013.01)

(58) Field of Classification Search
CPC ......... H01F 17/0006; H01F 2017/0046; H01F 2017/0073; H01F 2027/2809; H01F 27/2804; H01F 27/29; H03B 5/12–1296
See application file for complete search history.

(56) References Cited

U.S. PATENT DOCUMENTS

| 6,885,275 B1* | 4/2005 | Chang | H03J 3/185 336/200 |
| 7,382,222 B1* | 6/2008 | Manetakis | H01F 17/0006 336/200 |
| 7,671,714 B2 | 3/2010 | Tiemeijer | |
| 10,250,266 B2 | 4/2019 | Annema et al. | |
| 10,643,790 B2 | 5/2020 | Groves et al. | |
| 10,886,058 B2 | 1/2021 | Cho et al. | |
| 10,903,790 B1* | 1/2021 | Jin | H03B 5/1278 |
| 11,018,625 B1 | 5/2021 | Delke et al. | |

(Continued)

FOREIGN PATENT DOCUMENTS

WO 2003015110 A1 2/2003

OTHER PUBLICATIONS

Lopez-Villegas, J. M. et al; "Improvement of the Quality Factor of RF Integrated Inductors by Layout Optimization"; IEEE Trans. on Microwave Theory and Techiques, vol. 48, No. 1; pp. 76-83 (Jan. 2000).

(Continued)

*Primary Examiner* — Ryan Johnson

(57) ABSTRACT

In an embodiment, an integrated circuit die includes a semiconductor substrate, patterned metal layers compiled over the semiconductor substrate, and a tapered multipath inductor formed in the patterned metal layers. The tapered multipath inductor includes, in turn, an inductor input terminal, an inductor output terminal, and N number of parallel inductor tracks electrically coupled between the inductor input terminal and the inductor output terminal. The parallel inductor tracks wind or wrap around an inductor centerline to define a plurality of multipath inductor windings including an innermost winding and an outermost winding. The parallel inductor tracks further vary in track width when progressing from the outermost winding to the innermost winding of the plurality of multipath inductor windings.

18 Claims, 6 Drawing Sheets

(56) References Cited

U.S. PATENT DOCUMENTS

2004/0240126 A1    12/2004  Tiemeijer
2012/0044034 A1*  2/2012  Nazarian ............. H01L 23/5227
                                                                 336/200
2015/0364248 A1*  12/2015  Groves ............... H01L 23/5227
                                                                 336/232

OTHER PUBLICATIONS

Tiemeijer, T.F.. et al; "Record Q Spiral Industors in Standard CMOS"; Int'l Electron Devices Meeting, Technical Digest; pp. 40.7.1-40.7.3 (2001).

Tumma, S. et al; "High Performance Variable Width Multipath: Multilayer Differential Inductor"; IEEE India Council International Conference; pp. 1-5 (2017).

Peng AS et al: "Characterization and Modeling of Silicon Tapered Inductors", NSTI-Nanotech 2004, vol. 2, pp. 155-158 (2004).

\* cited by examiner

TAPERED MULTIPATH INDUCTORS

TECHNICAL FIELD

Embodiments of the present disclosure relate generally to microelectronics and, more particularly, to tapered multipath inductors, as well as inductor-capacitor oscillator circuits and integrated circuit dies containing tapered multipath inductors.

BACKGROUND

Inductor-capacitor (LC) oscillators commonly incorporate integrated inductors, which include coil- or spiral-shaped metal patterns formed over a suitable substrate, such as a printed circuit board or semiconductor die. To support high accuracy LC oscillator operation, an integrated inductor ideally possesses a relatively high quality factor (Q-factor). One manner in which the Q-factor of an inductor can be increased is through the deposition of multiple overlying or "stacked" patterned metal features, or a single, relatively thick metal (e.g., copper) layer, to define the inductor spiral pattern. While effectively boosting the inductor Q-factor, such a manufacturing approach may negatively influence inductor performance due to increased skin effect, proximity effect, and eddy currents. Such a manufacturing approach may also increase the inductance temperature coefficient (TCL) of the inductor. While tolerable in many applications, an increased TCL may be problematic in applications in which high accuracy LC oscillator performance is sought within demanding thermal environments requiring operation over broad (e.g., >200 degrees Celsius) temperature ranges. An ongoing demand thus exists for the development of integrated inductors having high Q-factors, low TCL values, and other desirable characteristics, while remaining amenable to straightforward and cost-effective production. Embodiments of such high performance integrated inductors are disclosed herein, as are LC oscillators and integrated circuit dies containing such inductors.

BRIEF DESCRIPTION OF THE DRAWINGS

At least one example of the present invention will hereinafter be described in conjunction with the following figures, wherein like numerals denote like elements, and.

Figure 1:
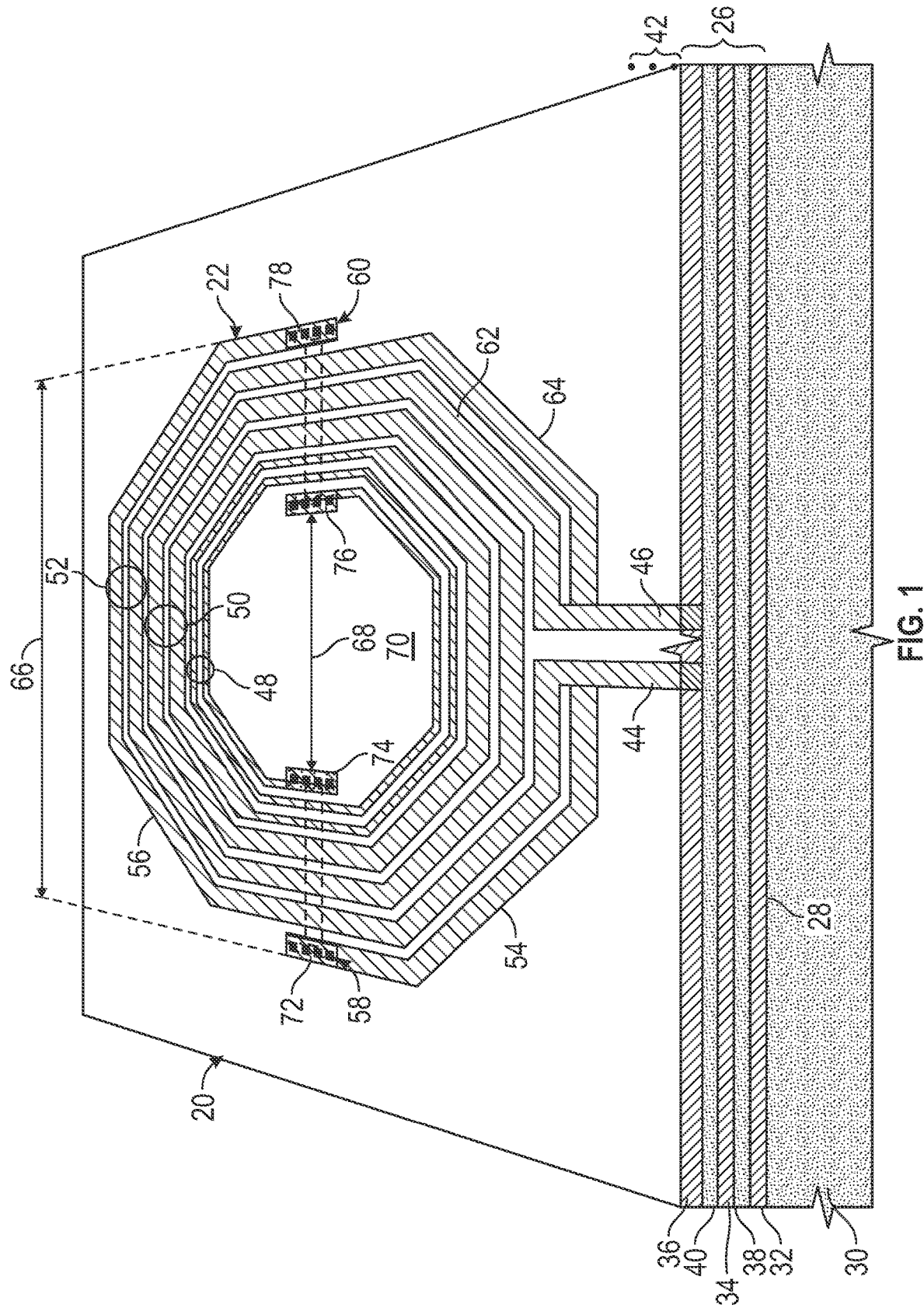
FIG. 1 is a perspective view of an integrated circuit (IC) die (partially shown) including an integrated tapered multipath inductor, as illustrated in accordance with an example embodiment of the present disclosure.

For simplicity and clarity of illustration, descriptions and details of well-known features and techniques may be omitted to avoid unnecessarily obscuring the example and non-limiting embodiments of embodiments of the tapered multipath inductor described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of embodiments of the tapered multipath inductor.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

As appearing herein, reference to a particular metal denotes that the referenced material is predominately composed of the named metal, by weight, and may contain any number of additional metallic or non-metallic constituents. As further appearing herein, the descriptor "tapered" as utilized in the term "tapered multipath inductor" is synonymous with "variable track width." Accordingly, the term "tapered multipath inductor" encompasses any multipath inductor having an inductor track width that varies, by design, when moving from an outermost inductor winding to an innermost inductor winding, and regardless of whether such variations in inductor track width occur in a relatively discrete, stepped fashion or in a more continual, gradual manner.

Overview

The following describes unique, tapered multipath inductors, as well inductor-capacitor (LC) oscillators and integrated circuit (IC) dies containing such inductors. Embodiments of the tapered multipath inductor are capable of providing both high quality factor (Q-factor) values and low inductance temperature coefficients (TCLs) over targeted operational frequency ranges. In certain instances, the tapered multipath inductor may achieve Q-factor values approaching or exceeding 10 and, perhaps, approaching or exceeding 20, depending upon inductor track dimensions, track composition, the patterned metal layer or layers in which the primary inductor windings are formed, and other design parameters; e.g., the choice of substrate and the present, or absence, of a ground shield underlying the inductor. Further, embodiments of the tapered multipath inductor may possess relatively low TCL values equal to or less than 40 parts per million per degree Celsius (ppm/° C.) and, perhaps, approaching 0 ppm/° C. in at least some instances over a targeted operational frequency range. When integrated into a high accuracy LC oscillator circuit, embodiments of the presently-disclosed tapered multipath inductors may favorably reduce the footprint of the oscillator, minimize oscillator power consumption, or provide both such benefits, while optimizing inductor radio frequency (RF) performance including when deployed into thermally-demanding operating environments; e.g., operating environments characterized by broad temperature variations potentially approaching or exceeding 200 degrees Celsius (° C.). As a still further benefit, embodiments of the tapered multipath inductor are readily fabricated utilizing existing manufacturing approaches or techniques, including complementary metal oxide semiconductor (CMOS) fabrication techniques, to enable integration of the tapered multipath inductor into circuit designs or IC die layouts with minimal cost and modification to existing fabrication flows.

Due, at least in part, to its multipath design, embodiments of the tapered multipath inductor are capable of achieving Q-factor values significantly greater those offered by inductors having more conventional single or unitary path designs, including tapered single path inductors. Concurrently, the tapered multipath inductor may achieve TCL values on par with tapered single path inductors. As indicated by the term "multipath," embodiments of the tapered multipath inductor can include any practical number of electrically-conductive paths, and therefore inductor tracks, greater than one. For example, in various implementations, the tapered multipath inductor may be fabricated to include 2 to 4 conductive paths, inclusive, to boost inductor Q-factor, while limiting the overall footprint or planform dimensions of the inductor. In other instances, such as when die area constraints are minimal, the tapered multipath inductor may be fabricated to a have a still greater number of inductor paths. In either case, the electrically-conductive, parallel-extending tracks of the inductor may define any practical number of 360° turns or windings, as determined by area constraints and other factors. Generally, the tapered multipath inductor will be patterned to include at least an innermost winding and an outermost winding; the terms "innermost" and "outermost" defined in view of the proximity of the windings to the center of the inductor spiral pattern. Collectively, the innermost winding, the outermost winding, and any number of intermediate windings principally define the primary coil- or spiral-shaped geometry of the inductor, which may follow various spiral-shaped patterns having, for example, generally circular or O-shaped, ovular, or polygonal (e.g., square-shaped, hexagonal, or octagonal) planform geometries. Embodiments of the presently-disclosed tapered multipath inductors may be formed in the patterned metal layers of integrated circuit (IC) dies, formed on (or within) a printed circuit board (PCB), or produced utilizing another suitable substrate.

As further indicated by the term "tapered" herein, the respective widths of the parallel inductor tracks vary in a predetermined (that is, by purposeful design) manner, with one or more transitions in parallel track width occurring as the inductor tracks progress from the outermost winding to the innermost winding. Such transitions in inductor track width may occur in a relatively gradual, contoured manner over a greater distance or inductor track length, but also may be more discrete, localized, or step-like in embodiments. In embodiments, the inductor track width decreases (or otherwise varies) at one or more discrete locations when moving from the outermost winding to the innermost winding of the integrated inductor. Alternatively, the inductor track width may vary (e.g., gradually increase or decrease) over the entirety or substantial entirety of the inductor spiral pattern in embodiments. In other instances, the inductor track width may increase when moving from the outermost inductor winding to the innermost inductor winding; or, instead, may initially increase (or decrease) and subsequently decrease (or increase) when progressing in this manner. The variations in inductor track width may be relatively pronounced in embodiments such that, in certain instances, the average inductor track width of the outermost inductor coil differs from (e.g., is greater than) the average inductor track width of the innermost inductor coil by a factor of at least 2. In addition to such variations in inductor track width, other key dimensional parameters of the tapered multipath inductor may be varied to optimize inductor performance or otherwise tune the inductor to best suit a particular application or usage. Such dimensional parameters may include, in particular, the parallel track spacing separating parallel inductor tracks and the winding-to-winding spacing separating adjacent multipath windings. These dimensions or parameters may be held constant in embodiments of the tapered multipath inductor; or, instead, either or both of these parameters be varied in accordance with, for example, an arithmetic sequence or a nonlinear progression. The parallel inductor tracks may also be produced to have substantially equivalent lengths in embodiments.

Embodiments of the presently-disclosed tapered multipath inductor may provide relatively low TCL values by, for example, increasing the uniformity of per-winding current distribution by mitigating eddy current effects, particularly for the innermost inductor winding. Additionally, in at least some instances, the central opening or keep-out region of the tapered multipath inductor can be minimized to provide a greater inductor density further reducing the overall footprint or planform dimensions of the inductor. Such an increase in inductor density by minimizing the central opening dimensions may result in a tradeoff of lower Q-factor values and higher TCL coefficients; however, the severity of this tradeoff is lessened in the context of the tapered multipath inductor relative to other conventional (e.g., non-tapered multipath and tapered single path) inductor designs. As a further benefit, embodiments of the tapered multipath inductor may have similar or reduced inductor resistance temperature coefficients (TCRs) as compared to single path tapered inductor. Due to such attributes, embodiments of the tapered multipath inductor may be beneficially utilized to construct LC circuits of various types, including LC circuits in which both highly accurate inductor operation in combination with low temperature dependencies are desirable over, for example, certain targeted operational frequency ranges. Examples of such circuits include low-power system clocks and phase-locked loop (PLL) systems, as discussed below in connection with FIG. 8. First, however, example embodiments of tapered multipath inductors are discussed in connection with FIGS. 1-3, while key characteristics (Q-factor and TCL values over targeted frequency ranges) of examples of the presently-disclosed tapered multipath inductors, as reduced to practice and contrasted against comparable non-tapered and single path inductors, are graphically presented in FIGS. 4-7.

Example Tapered Multipath Inductors and Integrated Circuit Dies

FIG. 1 is a perspective view of a limited portion of an IC die 20 fabricated to include an integrated tapered multipath inductor 22, as illustrated in accordance with an example embodiment of the present disclosure. In other embodiments, a tapered multipath inductor 22 (or multiple tapered multipath inductors) may be fabricated on a PCB or another substrate other than a die substrate. Tapered multipath inductor 22 is further depicted in FIG. 2, which features a detail bubble 24 identifying certain key dimensions of a main inductor spiral pattern. As indicated by the term "integrated," tapered multipath inductor 22 is formed in a number of frontside build-up layers 26, which are successively compiled on or built-up over the active frontside 28 of a semiconductor substrate 30 during wafer level processing. Five such build-up layers 26 are shown including first, second, and third patterned metal layers 32, 34, 36 (M1, M2, M3) interspersed with two dielectric layers 38, 40. In certain embodiments, the third patterned metal (M3) layer 36 may be the outermost or terminal metal layer of frontside build-up layers 26; while, in other implementations, additional patterned metal layers and dielectric layers may be formed above the third patterned metal (M3) layer 26, as indicated in FIG. 1 by symbol 42. In still other instances, a lesser number of patterned metal layers (e.g., two patterned metal layers) may be formed over frontside 28 of semiconductor substrate 30, with the principal spiral pattern of inductor 22 formed in one of the patterned metal layers and the below-described cross-coupling features provided in the other patterned metal layer. Additionally, although not shown in FIGS. 1 and 2 for clarity, a patterned ground shield may be formed on or in an IC die 20 at a location below tapered multipath inductor 22 in at least some instances.

The respective thicknesses and compositions of patterned metal features contained in frontside build-up layers 32, 34, 36 will vary between embodiments of IC die 20 and tapered multipath inductor 22. In at least some embodiments, the outermost patterned metal layer included in frontside build-up layers 26 may be composed of a first metal (e.g., aluminum (Al)), while the remaining patterned metal layers are composed of a second metal (e.g., copper (Cu)) deposited to an average thickness different than that of the outermost patterned metal layer. For example, in such embodiments, the outermost patterned metal (e.g., Al) layer may be electroplated or otherwise deposited to have a thickness between about 1 and about 3 microns (µm). Comparatively, the other, internal patterned metal layers within frontside build-up layers 26 may be relatively thin compared to the outermost patterned metal layer (e.g., these layers may be deposited to a thickness of a few hundred nanometers (nm) or less); and/or at least one of the internal metal layers within frontside build-up layers 26 may be formed as an ultra-thick metal (e.g., Cu) layer having a thickness ranging from, for example, about 3 to about 6 µm. All such layers thicknesses are measured along an axis orthogonal to die substrate frontside 28 (corresponding to the Z-axis of coordinate legend 86 shown in FIG. 2 and parallel to the below-described inductor centerline 84). Conventional lithography and metal patterning techniques can be utilized to produce integrated tapered multipath inductor 22 over frontside 28 of semiconductor substrate 30 by suitable deposition and lithographical patterning of photoresist masks, deposition of seed layers when appropriate, plating to build-up the patterned electrically-conductive features to desired thicknesses, and subsequent photoresist mask stripping. This stated, the particular manner in which tapered multipath inductor 22 is fabricated over semiconductor substrate 30 may be largely inconsequential to embodiments of the present disclosure, providing inductor 22 is imparted with a tapered multipath design or pattern including multiple inductor tracks varying in width in a predetermined manner, as discussed below.

As generically depicted in FIG. 1, semiconductor substrate 30 (partially shown) can assume the form of any layered or non-layered semiconductor-containing structure, which will often be composed of or consisting of singulated piece(s) of one or more wafers. A non-exhaustive list of examples for semiconductor substrate 30 includes bulk silicon (Si) substrates, silicon-on-insulator (SOI) substrates, and diamond-based and glass-based substrates. In still other implementations, semiconductor substrate 30 may assume the form of a high performance layered structure, such as layered Gallium Nitride (GaN) structures and layered Gallium Arsenide (GaAs) structures. As a specific example, semiconductor substrate 30 may assume the form of a gallium nitride/silicon carbine (GaN/SiC) structure containing a SiC layer, an overlying GaN layer, and any number of additional layers, such as an Al-containing GaN layer formed over the upper surface of GaN layer. As previously stated, only a relatively limited portion of semiconductor substrate 30 and, more generally, IC die 20 is shown in FIG. 1. Various other circuit elements, such as field effect transistors (FETs) or other transistors, may be formed in the non-illustrated portions of IC die 20 in at least some embodiments to provide a desired circuit structure, such as an LC circuit contained in a larger frequency generator (e.g., clock) or PLL circuit, an example of which is described below in connection with FIG. 8.

Among other regions or structural features, tapered multipath inductor 22 includes an inductor input terminal 44, an inductor output terminal 46, and a number of inductor coils or windings 48, 50, 52 electrically coupled in series between inductors terminals 44, 46. In other embodiments, terminal 44 may serve as the inductor output terminal, while terminal 46 serves as the inductor input terminal. Inductor terminals 44,46 are positioned in a laterally adjacent or side-by-side relationship in the illustrated example. By comparison, inductor windings 48, 50, 52 are situated in a substantially concentric relationship with each other, with a central opening or keep-out region 70 of inductor 22, and with a central inductor axis or "inductor centerline." As indicated above, the inductor centerline is represented by marker 84 in FIG. 2 and extends into and out of the page in this drawing figure (parallel to the Z-axis of coordinate legend 86), with the inductor windings wrapping around inductor centerline 84 and bounded by a plane orthogonal to centerline 84 (an X-Y plane of coordinate legend 86). At least two parallel inductor traces or tracks 62, 64 are electrically coupled between inductor input terminal 44 and inductor output terminal 46; the term "parallel" indicating that inductor tracks 62,64 extend in a side-by-side relationship along essentially parallel track centerlines as inductor tracks 62, 64 wind or spiral inwardly toward inductor centerline 84. Additionally, tapered multipath inductor 22 also includes two partial (less than 360°) inductor windings 54, 56 (referred to below as "inductor arms") and corresponding cross-coupling features 58, 60. Cross-coupling features 58, 60 electrically tie together or couple the outer terminal ends of inductor arms 54, 56 to the inner terminal ends of inductor tracks 62, 64. Parallel inductor tracks 62, 64, and to a lesser extent inductor arms 54, 56, define the principal spiral pattern of tapered multipath inductor 22.

In total, tapered multipath inductor 22 includes N number of conductive paths, and a corresponding number of parallel inductor tracks 62, 64, with N equal to 2 in the illustrated example. In further implementations, tapered multipath inductor 22 may be patterned to have more than two conductive paths and parallel tracks such that N is greater than two and perhaps, exceeds four. Generally, however, embodiments of the tapered multipath inductor will often contain between two and four paths such that $2 \leq N \leq 4$. By selecting N within this range, the benefits of the presently-disclosed multipath inductor design can be achieved (e.g., minimizing undesired current crowing effects and boosting inductor Q-factor), while limiting the overall footprint or planform dimensions of tapered multipath inductor 22. This notwithstanding, the outer dimension or width of tapered multipath inductor 22 (represented in FIG. 1 by double-headed arrow 66) will often be dictated, to a large extent, by die area constraints. Comparatively, due to the unique tapered, multipath design of inductor 22, and in contrast to more conventional (e.g., single path) inductor designs, the central opening or keep-out region 70 of tapered multipath inductor 22 may be reduced with a reduced impact on inductor performance; the term central "keep-out region" referring to a central area of inductor 22 circumscribed or bordered by innermost inductor coil 48. In certain embodiments, keep-out region 70 may be devoid of electrically-conductive features; while, in other instances, floating metal fills or tilings may be present within keep-out region 78 to, for example, satisfy physical design rule checks. Accordingly, in embodiments, the width of the central opening or keep-out region 70 of tapered multipath inductor 22 (dimension 68, FIG. 1) may approach or, perhaps, be less than 6 times of the average inductor track width of innermost winding 48 (e.g., $width_{WTW}$ identified in detail bubble 24 of FIG. 2). In one embodiment, the width of central keep-out region 70 (dimension 68, FIG. 1) is between 5 and 50 times the average inductor track width of innermost winding 48 ($width_{WTW}$) to optimize inductor density, while avoiding excessive deleterious effects (e.g., current crowding) that may otherwise result by imparting keep-out region 70 with a lesser width. In other instances, the width of central keep-out region 70 may be greater than or less than the aforementioned range.

Figure 2:
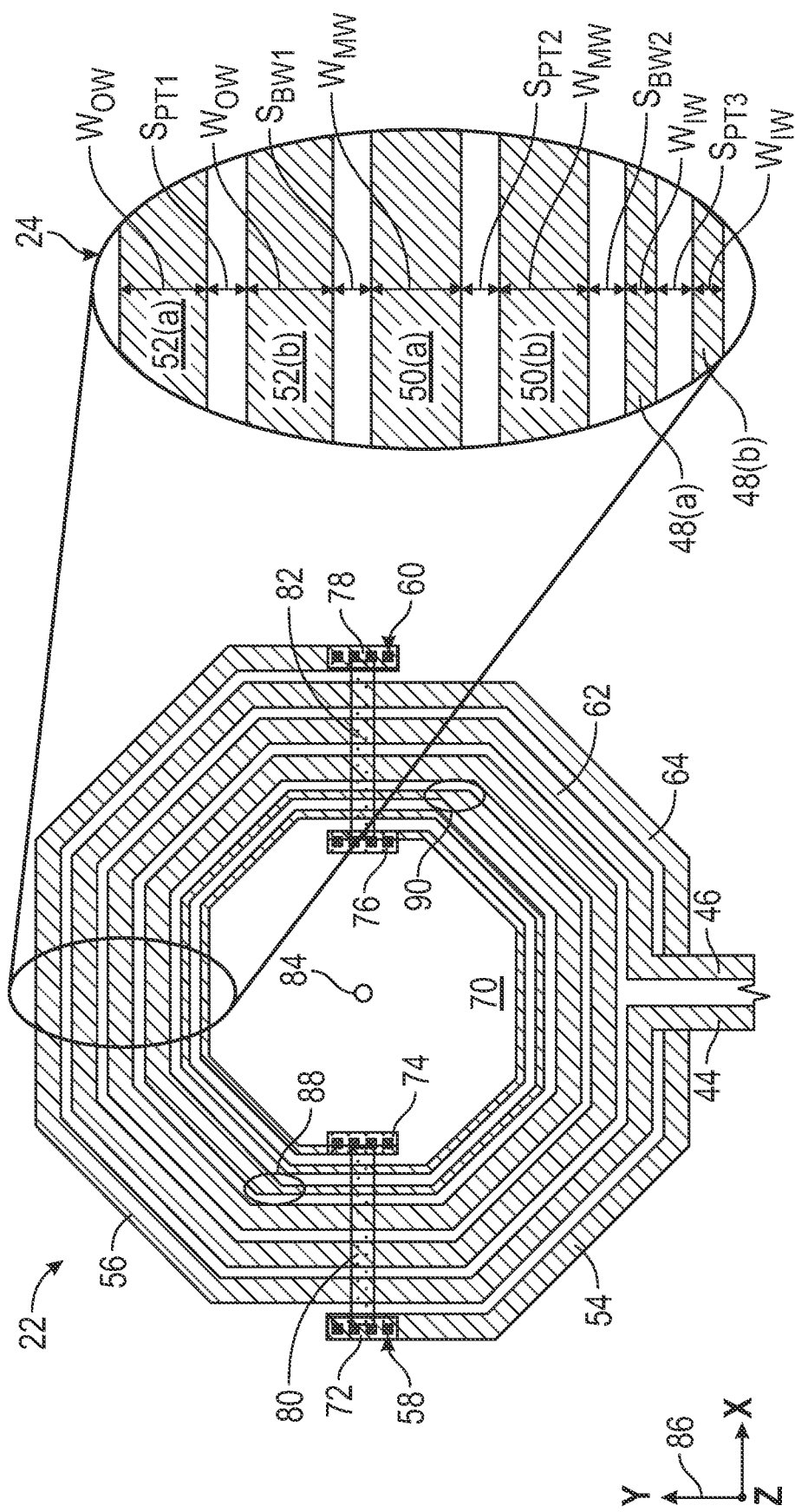
FIG. 2 is a generalized planform or top-down view of the tapered multipath inductor shown in FIG. 1 illustrating, in greater detail, one manner in which the inductor track widths may vary, while the track-to-track and winding-to-winding spacing remain constant, as considered when progressing from the outermost to the innermost winding of the example inductor.
Figure 3:
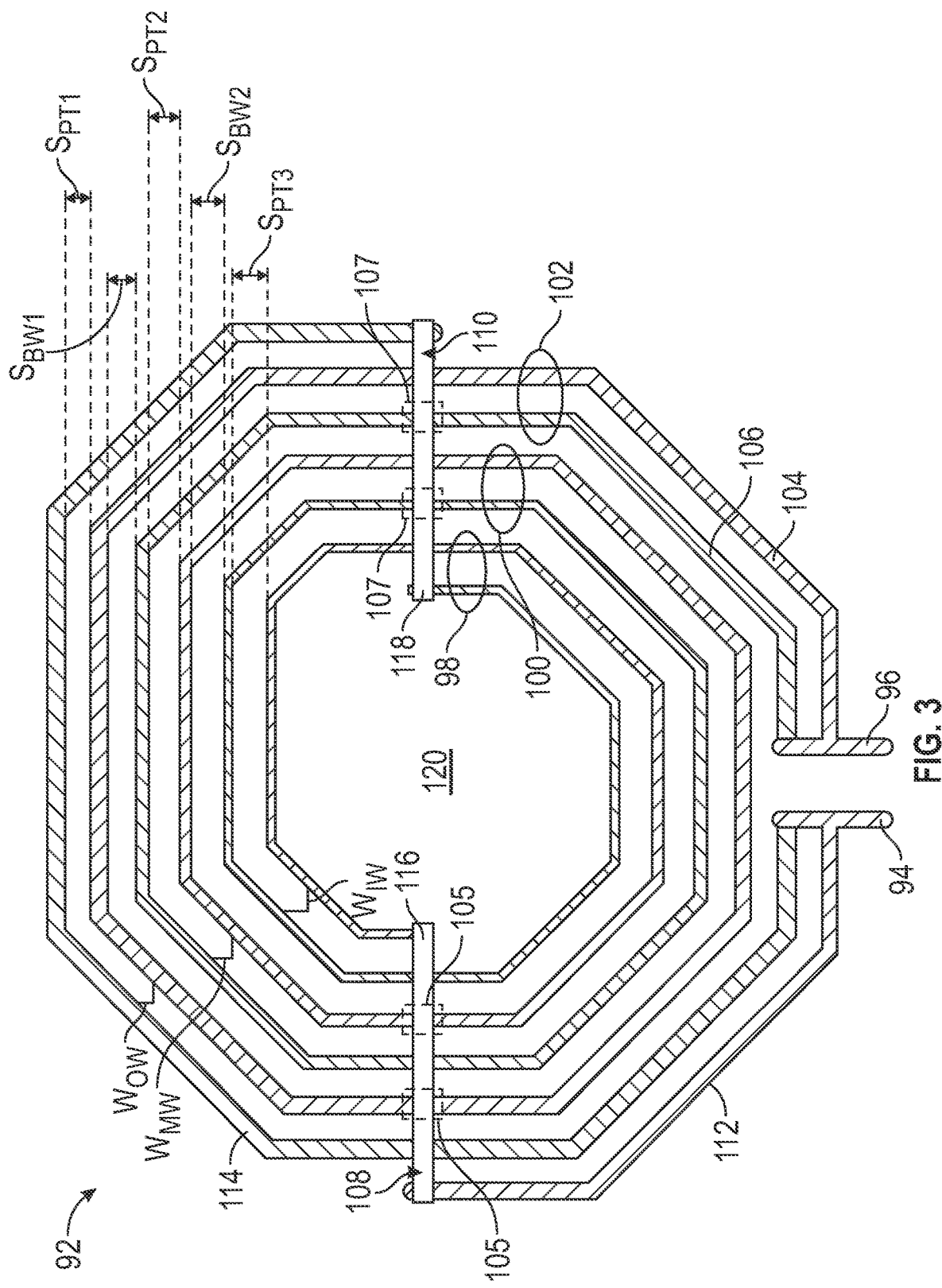
FIG. 3 is a generalized planform view of a tapered multipath inductor illustrating one manner in which the parallel inductor track widths may decrease when moving from the outermost to the innermost winding of the inductor, while the parallel track spacing and winding-to-winding spacing increase, as illustrated in accordance with a further example embodiment of the present disclosure.

With continued reference to example embodiment of FIGS. 1 and 2, cross-coupling features 58, 60 can assume any form and include any number of electrically-conductive structures (e.g., traces or tracks and conductive vias) suitable for electrically coupling outer inductor arms 54, 56 to the inner terminal ends of inductor tracks 62, 64. For example, and as shown most clearly in FIG. 2, cross-coupling features 58, 60 may include via structures 72, 74, 76, 78 (vias represented by square symbols) and relatively short electrically-conductive segments or "cross-tracks" 80, 82, which may extend principally in a radial direction relative to inductor centerline 84. More specifically, cross-tracks 80, 82 may extend either over or under inductor windings 48, 50, 52; and, in combination with via structures 72, 74, 76, 78, provide desired electrical interconnections between the outer terminals ends of inductor arms 54, 56 and the inner terminal ends of inductor windings 48, 50, 52. In this regard, outer inductor arm 54 extends from input terminal 44 in a first rotational direction (here, clockwise), wraps around centerline 84 of tapered multipath inductor 22 by one quarter turn (90° as taken about centerline 84), and terminates at via structure 72 of cross-coupling feature 58. Via structure 72 includes one or more vias, such as a tub via, a bar via, or one or more rows of vias, which carry an electrical connection from the pad of structure 72 vertically toward or away from die substrate frontside 28 to cross-track 80. Cross-track 80 is located in a different patterned metal layer of frontside layers 26 than is the patterned metal features defining the primary spiral-shaped geometry of inductor 22 and, thus, extends either under or over windings 48, 50, 52 to connect with via structure 74.

Via structure 74 of cross-coupling feature 58 includes one or more vias, which carry the electrical connection to the level or vertical position of the primary spiral-shaped geometry of tapered multipath inductor 22 and specifically to the inner terminal end of inductor track 64; the term "vertical," as appearing herein, synonymous with a thickness direction or a direction parallel to inductor centerline 84. In this manner, the outer terminal end of outer inductor arm 54 is electrically coupled to the inner terminal end of inductor track 64 or, more generally, an inner terminal end of innermost inductor winding 48 without undesired electrical shorting of the other inductor windings. To facilitate the formation of cross-coupling feature 58, and to provide the desired number of complete, multipath windings (here, 3 windings), outer inductor arm 54 may be patterned to terminate at angular location or clock position generally matching or corresponding to the angular location or clock position at which inductor track 64 terminates; e.g., at about a 270° or 9 o'clock position, as measured about inductor centerline 84 in a clockwise direction. This may also be described as outer inductor arm 54 terminating at a location substantially radially aligned with the location at which the inner terminal end of inductor track 64 terminates, as taken along an axis perpendicular to centerline 84. The spatial relationship between the respective terminals of outer inductor arm 56 and an inductor track 62 can be described in a similar manner, but with the outer terminal end of inductor arm 56 and the inner terminal end of inductor track 62 terminating at about a 90° or 3 o'clock position in the illustrated example.

In a manner akin to quarter-turn inductor arm 54 and cross-coupling feature 58, inductor arm 56 extends from input terminal 44 in the first rotational direction (clockwise), wraps around the centerline of tapered multipath inductor 22 (marker 84) by three quarters turn (270°), and terminates at via structure 78 of cross-coupling feature 60. The electrically-conductive via or vias within via structure 78 carry the electrical signal to a contact pad located within another patterned metal layer or level within frontside build-up layers 26 differing from the layer in which the primary spiral pattern of inductor 22 is formed. Cross-track 82 (FIG. 2) extends from this contact pad, whether under or over the vertically-overlapping turns of tapered multipath inductor 22, to connect to the corresponding via structure 76. The electrical signal is then conducted by the vias within via structure 76 to the pad located within the patterned metal layer containing the primary inductor spiral pattern. This pad physically connects to, and is thus electrically coupled to, the inner terminal end of innermost inductor winding 48 and, specifically, to the inner terminal end of inductor track 62. In this manner, cross-coupling feature 60 electrically couples the outer terminal end of inductor arm 56 to the inner terminal end of inductor track 62 in essentially the same manner as cross-coupling feature 58 electrically couples the outer terminal end of inductor arm 54 to the inner terminal end of inductor track 64 to complete the desired wiring structure of tapered multipath inductor 22.

As previously indicated, cross-tracks 80, 82 included in cross-coupling features 58, 60, respectively, are each located in a different patterned metal layer of frontside build-up layers 26 than is the patterned metal features defining the primary spiral shape of inductor 22. Cross-tracks 80, 82 will often, but need not necessarily be formed in the same patterned metal layer of frontside build-up layers 26. Further, in various implementations, cross-tracks 80, 82 and the main spiral pattern of inductor 22 (the plurality of multipath inductor windings) may be formed in different layers and composed of as different metals or other disparate electrically-conductive materials. For example, in certain embodiments, the main spiral shape or coil pattern of inductor 22 may be formed in a metal layer above cross-tracks 80, 82 and, perhaps, in the outermost patterned metal (e.g., Al) layer of frontside build-up layers 26. In this case, cross-coupling features 58, 60 may be formed in a lower patterned metal (e.g., Cu) layer and may be more specifically referred to as a "cross-under" couplings. In other instances, cross-tracks 80, 82 may be formed in a metal layer or elevation above the main spiral pattern of inductor 22 and, perhaps, may be formed in the outermost patterned metal (e.g., Al) layer of frontside build-up layers 26; the term "below" and "above" defined herein in view proximity to semiconductor substrate 30 taken along centerline 84. In this latter instance, cross-coupling features 58, 60 may be more specifically referred to as a "cross-over" couplings. In still other embodiments, the electrically-conductive features defining the main inductor spiral pattern may be electrically coupled in another manner and/or tapered multipath inductor 22 may include a greater number of cross-couplings, whether provided as cross-over couplings, cross-under couplings, or a combination thereof, when inductor 22 contains three or more parallel conductive paths electrically coupled between inductor terminals 44, 46 such that N≥3.

In the example of FIGS. 1 and 2, tapered multipath inductor 22 is imparted with an octagonal spiral- or coil-shaped pattern or planform geometry, as seen looking downwardly onto inductor 22 along centerline 84. In other embodiments, tapered multipath inductor 22 may instead be imparted with a polygonal shape having a greater or lesser number of sides, such as a square-shaped or hexagonal-shaped planform geometry. In still other instances, tapered multipath inductor 22 may be patterned to have a circular or ovular (e.g., O-shaped) planform geometry. It will often be the case that the primary spiral shape or pattern of tapered multipath inductor 22 is formed in a single patterned metal layer, such as patterned metal layer 36 shown in FIG. 1; however, it is possible for the windings or turns of multipath inductor 22 to be formed in multiple patterned metal layers to impart inductor with an increasingly three dimensional shape as, for example, the number of inductor paths increase. Regardless of the particular spiral-shaped pattern followed by inductor 22, parallel inductor tracks extend in a side-by-side or laterally adjacent relationship. As the inductor tracks progress from outermost winding 52 to innermost winding 48, the respective widths of the parallel inductor tracks vary. Such transitions in track width may occur in a relatively gradually or contoured manner over a greater distance or fraction of the inductor track length, but also the track width variations may be more discrete or step-like in embodiments. In the illustrated example, specifically, tracks 62, 64 each undergo at least one transition or tapering (here, a decrease or narrowing) in width when moving from outermost winding 52 to innermost winding 48 included in the plurality of inductor windings. The width transition points or regions are relatively discrete or localized as indicated in FIG. 2 by circled region 88 (identifying the width transition of track 64) and circled region 90 (identifying the width transition of track 62). Such width transition points or regions are diametrically opposed in the illustrated example taken about centerline 84. In other embodiments, the regions over which inductor track 62,64 transition in width may be more gradual and, perhaps, may occur over the entirety of the inductor spiral pattern when moving from outermost winding 52 to innermost winding 48. Parallel inductor tracks 62, 64 may also be produced to have substantially equivalent lengths in embodiments.

An example of one manner in which tapered multipath inductor 22 may be imparted with a variable track widths will now be discussed in connection with detail bubble 24 shown in FIG. 2. Parallel inductor tracks in this circled region of inductor 22 are denoted by an appended "a" or "b" and the relevant winding reference numeral. Accordingly, within detail bubble 24 (FIG. 2), the depicted segments of the parallel inductor tracks (here, tracks 56, 62) forming outermost winding 52 are identified as "52(a)" and "52(b)," respectively; the segments of the parallel inductor tracks (tracks 62, 64) forming intermediate winding 50 are identified as "50(a)" and "50(b)"; and the segments of the parallel inductor tracks (tracks 62,64) forming innermost winding 48 are identified as "48(a)" and "48(b)." As measured along an axis perpendicular to inductor centerline 84 at locations intersecting windings 48, 50, 52, inductor track segments 52(a), 52(b) in outermost winding 52 are imparted with an outer winding inductor track width (identified by double-headed arrow "$W_{OW}$"); inductor tracks 48(a), 48(b) in innermost winding 48 are imparted with a second (inner winding) inductor track width (identified by double-headed arrow "$W_{IW}$"); and inductor tracks 50(a), 50(b) in intermediate winding 50 are imparted with a third (middle winding) inductor track width (identified by double-headed arrow "$W_{MW}$"). As indicated above, the inductor track widths are measured along axes orthogonal to the respective inductor track centerlines (that is, the line followed by a given inductor track and extending in the X-Y plane of coordinate legend 86) and the thickness direction (again, corresponding to the Z-axis of coordinate legend 86); or, stated differently, along an axis perpendicular to inductor centerline 84 (FIG. 2). Accordingly, and referring to circled region (detail bubble) 24 only, the inductor track widths are measured along an axis corresponding to or extending parallel to the Y-axis of coordinate legend 86.

In the example of FIGS. 1 and 2, the inductor track widths of outermost winding 52 and intermediate winding 50 are equivalent, while the inductor track widths of innermost winding 48 are less than that of outermost winding 52 and intermediate winding 50. This may be expressed as $W_{OW} \approx W_{MW} > W_{IW}$. Accordingly, each inductor track 62,64 undergoes a single transition to a reduced width or narrowing when progressing from outermost winding 52 to innermost winding 48. The precise values of $W_{OW}$, $W_{MW}$, $W_{IW}$ will vary among embodiments, as will the proportional relationship between these values. This stated, it may be the case that tracks 62, 64 undergo a transition (e.g., a decrease or narrowing) in average track width of at least 50% when moving from outermost winding 52 to innermost winding 48 (also described as "winding or spiraling towards centerline 84"). Accordingly, in the present example, parallel inductor tracks 62, 64 may be dimensioned or patterned such that $W_{OW}$ and $W_{MW}$ are at least 50% greater than $W_{IW}$ ($W_{OW}$≈$W_{MW}$>1.5($W_{IW}$)); and, perhaps, are at least twice the value of $W_{IW}$ ($W_{OW}$≈$W_{MW}$>2($W_{IW}$)). In one embodiment, $W_{OW}$ and $W_{MW}$ range from about 7 to about 9 μm, while $W_{IW}$ ranges from about 2 to about 4 μm. In other instances, $W_{OW}$, $W_{MW}$, and $W_{IW}$ may be greater than or less than the aforementioned ranges. For example, in another embodiment, the inductor track width may decrease (or otherwise vary) with each winding moving radially inward towards centerline 84 such that $W_{OW}$>$W_{MW}$>$W_{IW}$. In such an instance, the average inductor track widths of outermost winding 52 may be still at least twice the average inductor track widths of innermost winding 48 such that the foregoing relationship applies, while $W_{OW}$≥$W_1$. More generally, inductor tracks 62, 64 may undergo any practical number of transitions in track width, with the track width narrowing (or otherwise varying) when progressing from outermost winding 52 to innermost winding 48. Lastly, with respect to track thickness, tracks 62, 64 may be deposited to have a substantially constant thickness from outermost winding 52 to innermost winding 48, which may range from about 1 to about 6 μm in an embodiment.

As previously indicated, the respective widths of inductor tracks 62, 64 are measured along axes perpendicular to inductor centerline 84 (FIG. 2). Further measured in this manner are: (i) the track spacing separating N number of parallel tracks for a given inductor winding (referred to herein as the "parallel track spacing"), and (ii) the spacing separating adjacent windings within the main spiral pattern of inductor 22 (referred to herein as the "winding-to-winding spacing"). With continued reference to detail bubble 24 shown in FIG. 2, the parallel track spacing between inductor track segments 52(a), 52(b) of outermost winding 52 is identified by double-headed arrow $S_{PT1}$, the parallel track spacing between inductor track segments 50(a), 50(b) of intermediate winding 50 is identified by double-headed arrow $S_{PT2}$, and the parallel track spacing between inductor track segments 48(a), 48(b) of innermost winding 48 is identified by double-headed arrow $S_{PT3}$. Similarly, the winding-to-winding spacing separating outermost winding 52 and intermediate winding 50 of inductor 22 is identified by double-headed arrow $S_{BW1}$, ("BW" denoting "between winding"), while the winding-to-winding spacing separating intermediate winding 50 and innermost winding 48 is identified by double-headed arrow $S_{BW2}$. In the example of FIGS. 1 and 2, tapered multipath inductor 22 has a substantially constant winding-to-winding spacing and a substantially constant parallel track spacing such that $S_{PT1}$≈$S_{PT2}$≈$S_{PT2}$ and $S_{BW1}$≈$S_{BW2}$. As appearing herein, the terms "substantially constant" and "substantially equivalent" are defined to encompass variations of no more than 10%.

In alternative embodiments, the winding-to-winding spacing and the parallel track spacing of tapered multipath inductor 22 vary in a predetermined manner (that is, by purposeful design) when progressing from outermost winding 52 to innermost winding 48. When applicable, such variations in winding-to-winding spacing and/or parallel track spacing may be implemented in any desired manner, such as in accordance with an arithmetic sequence or a nonlinear progression, to fine tune inductor behavior, to best suit a particular application, or for another reason. Consider, in this latter regard, tapered multipath inductor 92 shown in FIG. 3 and illustrated, in a simplified form, in accordance with a further example embodiment of the present disclosure. In many respects, tapered multipath inductor 92 (FIG. 3) is similar to tapered multipath inductor 22 described above in connection with FIGS. 1 and 2. As was previously the case, tapered multipath inductor 92 includes an inductor input (or output) terminal 94, an inductor output (or input) terminal 96, and a plurality of multipath concentric inductor windings 98, 100, 102. Inductor windings 98, 100, 102 are defined, in principal part, by N number of inductor tracks (here, two inductor tracks 104, 106), which are electrically coupled between inductor input terminal 94 and an inductor output terminal 96 and which wind or spiral about a non-illustrated inductor centerline. Tapered multipath inductor 92 is imparted with an octagonal spiral pattern in the illustrated example, with the innermost inductor coil or winding 98 surrounding a central opening or keep-out area 120 of inductor 92. The statements regarding spiral pattern variations and the dimensioning of the keep-out area of tapered multipath inductor 22 (FIGS. 1 and 2) set-forth above apply equally to tapered multipath inductor 92 and will not be repeated in detail for concision. Further, although not shown in FIG. 3, it will be appreciated that electrically-conductive features comprising inductor 92 are formed in patterned metal layers build-up over the frontside of a semiconductor die substrate, such as semiconductor substrate 30 described above in connection with FIG. 1.

Tapered multipath inductor 92 includes two partial windings or inductor arms 112, 114 and two cross-over structures 108, 110. Cross-over structures 108, 110 electrically interconnect the outer terminal ends of inductor arms 112, 114 with the inner terminal ends of inductor tracks 104, 106 and innermost winding 98 in a manner analogous to that previously described. In particular, cross-over features 108, 110 include non-labeled vias, which extend vertically (into or out of the page in FIG. 3) to connect to cross-tracks 116, 118. Cross-tracks 116, 118 then extend under or over the windings of inductor 92 to provide the desired interconnections between the outer terminal ends of inductor arms 112, 114 and the inner terminal ends of inductor windings 104, 106. Once again, the respective widths of the parallel inductor track for windings 102, 100, 98 are identified as $W_{OW}$, $W_{MW}$, and $W_{IW}$, respectively; the parallel track spacings for windings 102, 100, 98 are identified by double-headed arrows $S_{PT1}$, $S_{PT2}$, and $S_{PT3}$, respectively; the winding-to-winding spacing separating outermost winding 102 and intermediate winding 100 is denoted by double-headed arrow $S_{BW1}$; and the winding-to-winding spacing separating intermediate winding 100 and innermost winding 98 is denoted by double-headed arrow $S_{BW2}$. Again, the order of introduction of such key dimensions may vary in other portions of this document such that, for example, winding 102 and winding 98 may be described as having "first" and "second" inductor track widths when appropriate. In this example, and in contrast to inductor 22 described above in connection with FIGS. 1 and 2, the inductor track widths decrease or narrow at multiple junctures: first, when moving from outermost winding 102 to intermediate winding 100 and, again, when moving from intermediate winding 100 to innermost winding 98. This may be expressed mathematically as $W_{OW}$>$W_{MW}$>$W_{IW}$. The transition points over which inductor track 104 narrows are again diametrically opposed relative to the transition points over which parallel inductor track 106 narrows, as taken about the inductor centerline. This may be appreciated by comparing the locations of boxed regions 105 (the narrowing or step-down regions of inductor track 104) to the locations of boxed regions 107 (the narrowing or step-down regions of inductor track 106) in FIG. 3.

As noted above, the inductor track widths of inductor 92 decrease or narrow when moving from outermost winding 102 ($W_{OW}$) to intermediate winding 100 ($W_{MW}$) and, again, when moving from intermediate winding 100 ($W_{MW}$) to innermost winding 98 ($W_{IW}$). In various implementations, the average track width of outermost inductor winding 102 (or $W_{OW}$) may be at least twice the value of the average track width of innermost inductor winding 98 (or $W_{IW}$). Additionally or alternatively, in embodiments, $W_{OW}$ may vary from about 3 to about 5 μm; $W_{MW}$ may vary from about 7 to about 9 μm; and $W_{IW}$ may vary from about 11 to about 13 μm. In other implementations, the respective values of $W_{OW}$, $W_{MW}$, $W_{IW}$ may be greater than or less than the aforementioned ranges. Further, in the example of FIG. 3, and in contrast to tapered multipath inductor 22 discussed above in connection with FIGS. 1 and 2, the parallel track and winding-to-winding spacing of tapered multipath inductor 92 increases or widens when progressing from outermost winding 102 to intermediate winding 100 and, again, when progressing from intermediate winding 102 to innermost winding 98 such that $S_{PT1}<S_{PT2}<S_{PT3}$ and $S_{BW2}<S_{BW1}$. Again, the particular values of $S_{PT1}$, $S_{PT2}$, $S_{PT3}$ and $S_{BW1}$, $S_{BW2}$ will vary between embodiments and can be selected, by design, to tailor the operation of inductor 92 for a particular application or usage. For example, in certain instances, the between winding spacing may increase incrementally when moving from outermost winding 102 to intermediate winding 100 depending upon the desired tradeoff between Q-factor, TCL, and inductance values. In other embodiments, the values of $S_{PT1}$, $S_{PT2}$, $S_{PT3}$ and $S_{B1}$, $S_{B2}$ may differ from this example; or the inductor may be patterned such that parallel track spacings and the winding-to-winding spacing remain substantially constant when moving from the outermost inductor winding to the innermost inductor winding, as described above in connection with tapered multipath inductor 22.

As emphasized throughout this document, embodiments of the presently-disclosed tapered multipath inductor are capable of providing both high Q-factor and low TCL values over targeted operational frequency ranges, including over low Gigahertz (GHz) frequency ranges from about 1 to about 3 GHz. For at least this reason, embodiments of the tapered multipath inductor are well-suited for incorporation into applications benefiting from high accuracy LC oscillator operation over relatively broad temperature ranges. Examples of Q-factor and TCL values that may be achieved by several example embodiments of the tapered multipath inductor, as reduced to practice through simulations or physical testing, are graphically represented in FIGS. 4-7. Referring initially to graph 122 shown in FIG. 4, variations in inductor Q-factor (vertical axis) over a selected frequency range (horizontal axis) are plotted for a tapered multipath inductor having a first set of structural characteristics (characteristic or trace 124) relative to a non-tapered multipath inductor (trace 126) and tapered single path inductor (trace 128) having comparable inductance values, inner dimensions, and winding counts. Similarly, graph 130 shown in FIG. 5, plots variations in TCL values (vertical axis) over a selected frequency range (horizontal axis) for the example tapered multipath inductor (trace 132), the non-tapered multipath inductor (trace 134), and the tapered single path inductor (trace 136). In this example, the tapered multipath inductor is similar or substantially identical to inductor 22 discussed above in connection with FIGS. 1 and 2, wherein the windings defining the main spiral pattern (e.g., windings 48, 50, 52) are formed in a patterned Cu layer and have a thickness ranging from about 3 to about 6 μm; the cross-coupling features (e.g., features 58, 60) are formed as cross-over features, with the cross-tracks (e.g., cross-tracks 80, 82) formed in a patterned metal (e.g., Al) metal layer above the metal layer in which the main spiral pattern is defined; and the inductor pattern is dimensioned such that $W_{OW} \approx 3$ μm, $W_{MW} = W_{IW} \approx 9$ μm.

Figure 4:
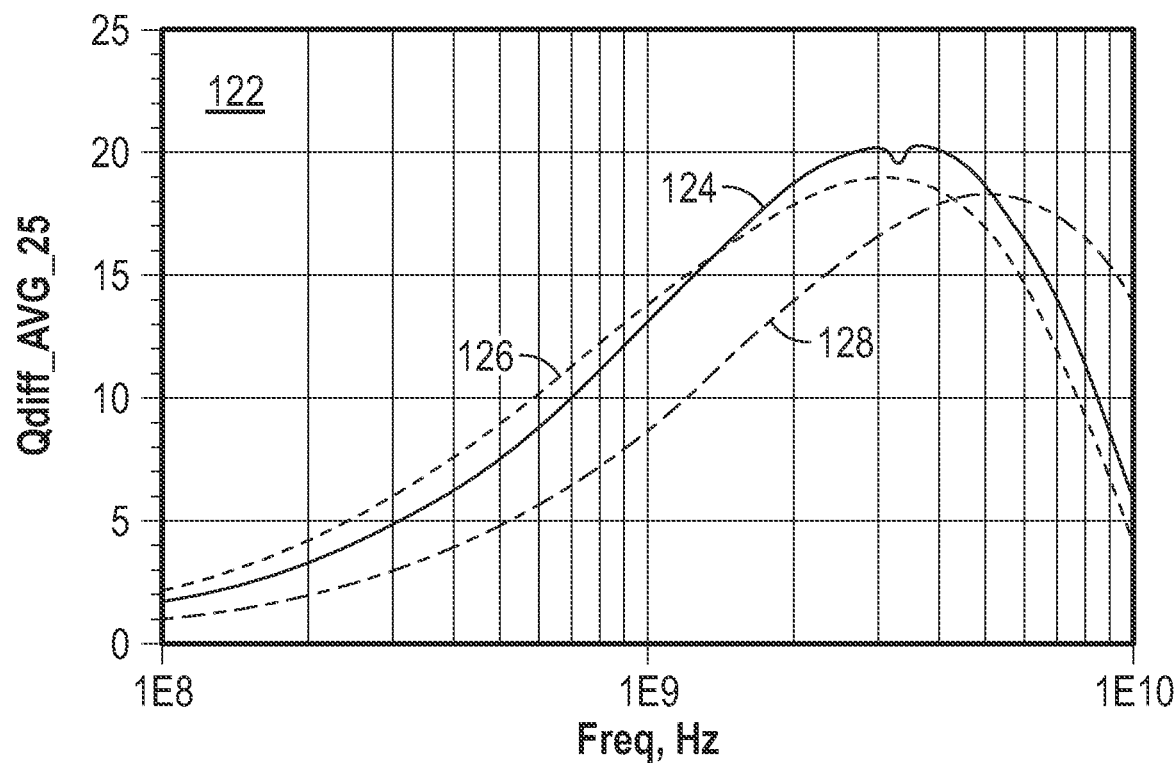
FIG. 4 is a graph plotting variations in inductor Q-factor (vertical axis) over a selected frequency range (horizontal axis) for a tapered multipath inductor having a first set of structural characteristics (reduced to practice in accordance with an example embodiment of the present disclosure) relative to a tapered single path inductor and a non-tapered multipath inductor.
Figure 5:
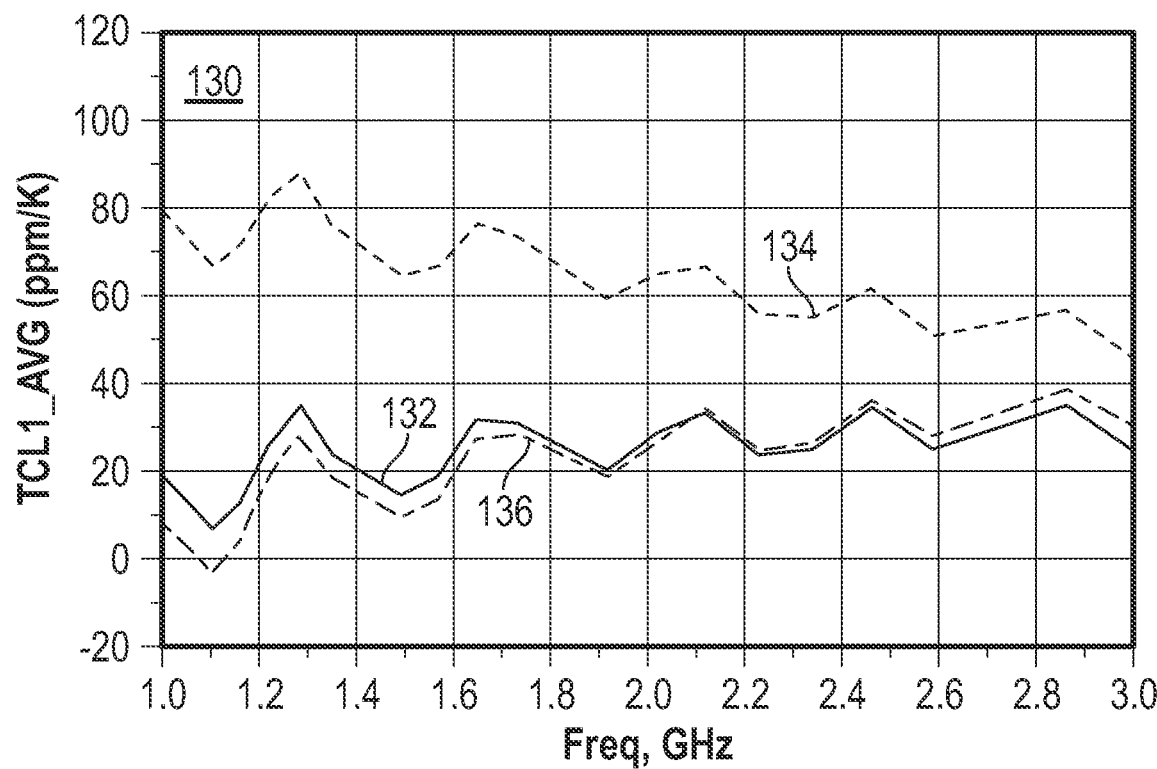
FIG. 5 is a graph plotting variations in inductance temperature coefficient (TCL) values (vertical axis) over a selected frequency range (horizontal axis) for the example tapered multipath inductor, the tapered single path inductor, and the non-tapered multipath inductor compared in FIG. 4.

With continued reference to the graphs shown in FIGS. 4 and 5, it can be seen that the measured multipath tapered inductor (trace 124, FIG. 4) achieves exceptionally high Q-factor values, here Q-factor values approaching or exceeding 20, particularly over a frequency range of interest between 1 and 10 GHz. Over this frequency range, the Q-factor values of the multipath tapered inductor (trace 124) exceeds both the Q-factor values of the non-tapered multipath inductor (trace 126) and tapered single path inductor (trace 128). This is a significant benefit, particularly when the multipath tapered inductor is incorporated into an LC oscillator circuit for which high accuracy performance is sought Concurrently, as may be appreciated by reference to graph 130 (FIG. 5), the tapered multipath inductor (trace 132) achieves low TCL values over a targeted frequency range. The TCL values achieved by the tapered multipath inductor are on par with those of the comparable tapered single path inductor (trace 136) and considerably less than the TCL values of the non-tapered multipath inductor (trace 134). Accordingly, by comparing graph 122 (FIG. 4) to graph 130 (FIG. 5), it can be readily appreciated that the tapered multipath inductor is capable of maintaining high quality characteristics over a broad temperature range, given that inductor performance is rendered largely insensitive to pronounced shifts or variations in temperature.

Figure 6:
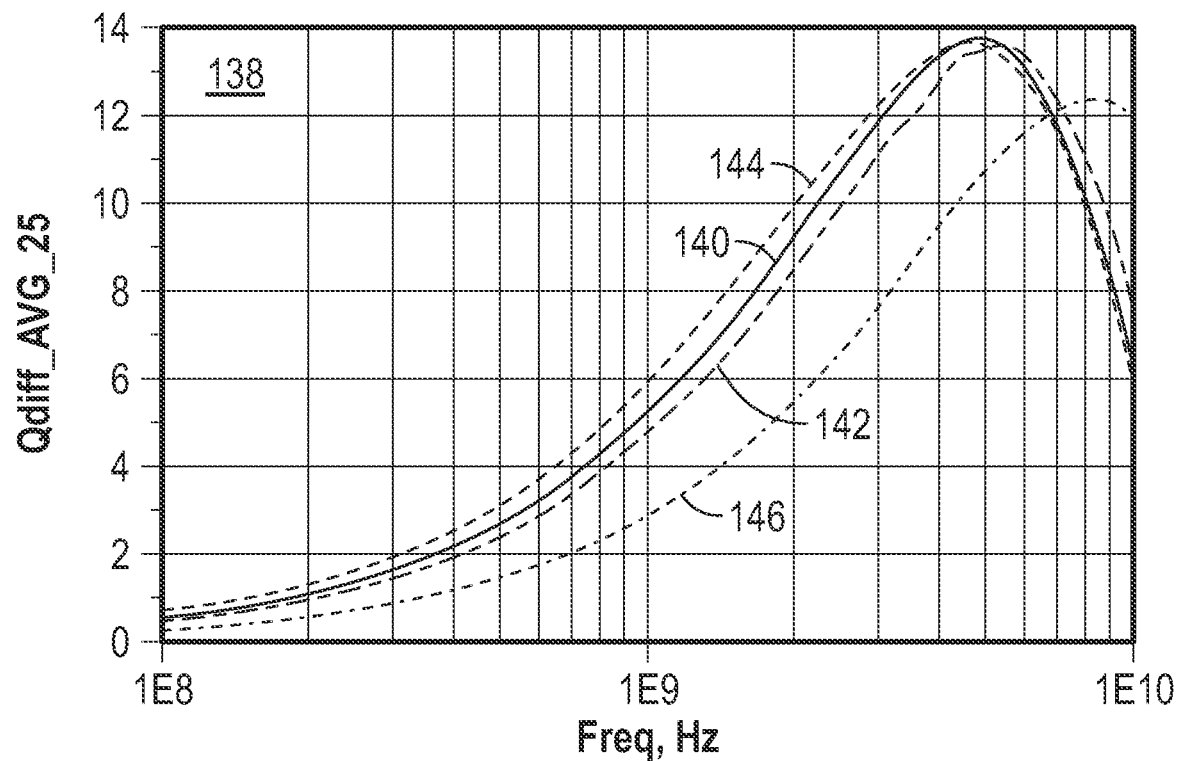
FIG. 6 is a graph plotting the variations in Q-factor (vertical axis) over a selected frequency range (horizontal axis) for tapered multipath inductors having second and third sets of structural characteristics (reduced to practice in accordance with additional example embodiments), a tapered single path inductor, and a non-tapered multipath inductor.
Figure 7:
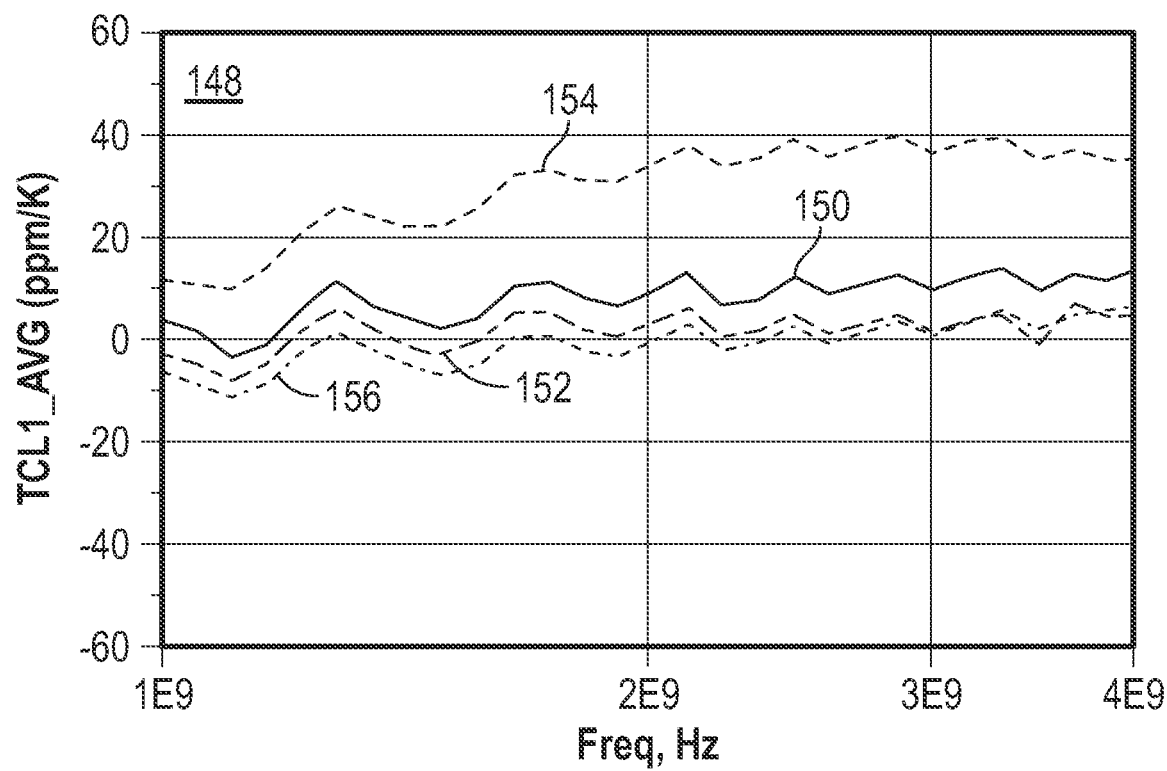
FIG. 7 is a graph further plotting the variations in TCL values (vertical axis) over a selected frequency range (horizontal axis) for the tapered multipath inductors, the tapered single path inductor, and the non-tapered multipath inductor set-forth in FIG. 6.

Turning to FIGS. 6 and 7, Q-factor and TCL characteristics are graphically expressed for two additional example tapered multipath inductors. Specifically, graph 138 shown in FIG. 6 plots the variations in Q-factor (vertical axis) over a selected frequency range (horizontal axis) for tapered multipath inductors having second and third sets of structural characteristics (traces 140, 142), a comparable non-tapered multipath inductor (trace 144), and a comparable tapered single path inductor (trace 146). Comparatively, graph 148 (FIG. 7) expresses variations in TCL values (vertical axis) over a selected frequency range (horizontal axis) for the example tapered multipath inductors (traces 150, 152), the non-tapered multipath inductor (trace 154), and the tapered single path inductor (trace 156). In this set of examples, and as was the case for the tapered multipath inductor plotted in FIGS. 4 and 5, the tapered multipath inductors may again generally correspond with the spiral-shaped pattern of tapered multipath inductor 22 set-forth in FIGS. 1 and 2; e.g., each of the measured inductors may have the same N value (here, two) and winding count as does inductor 22. However, in this example and in contrast to the tapered multipath inductor plotted in FIGS. 4 and 5, the inductor spiral pattern (windings 48, 50, 52) of the tapered multipath inductors are imparted with a lesser thickness (e.g., a thickness of less than 3 μm and, perhaps, equal to about 2 μm) and are principally composed of Al, by weight. Further, in the instant set of examples, cross-coupling features (e.g., features 58, 60 shown in FIGS. 1 and 2) are cross-under features with the cross-tracks (e.g., cross-tracks 80, 82 shown in FIG. 2) formed in a lower (e.g., Cu) metal layer of the frontside build-up layers. Additionally, and with reference to detail bubble 24 of FIG. 2, the example tapered multipath inductor corresponding to traces 140, 150 is dimensioned or patterned to have the following inductor track widths: $W_{OW} \approx 12$ μm, $W_{MW} \approx 8$ μm, $W_{IW} \approx 4$ μm. Lastly, the example tapered multipath inductor corresponding to traces 142, 152 is patterned such that $W_{OW} \approx W_{MW} \approx 9$ μm, $W_{IW} \approx 3$ μm. Again, the non-tapered multipath inductor and tapered single path inductor (corresponding to traces 144, 146, 154, 156) are imparted with planform dimensions similar or substantially identical to those of the example tapered multipath inductor corresponding to traces 140, 142, 150, 152.

Referring to traces 140, 142 shown in FIG. 6, the plotted example tapered multipath inductors provide high Q-factor values over a frequency range of interest. In this set of examples, the peak Q-factor values approach 14 and are consequently on par with those achieved by a comparable non-tapered or fixed track width multipath inductor (trace 144), while exceeding the Q-factor values of the plotted tapered single path inductor (trace 146). The plotted example tapered multipath inductors (traces 150, 152) further exhibit TCL values similar, if not substantially identical to the tapered single path inductor (trace 156) and significantly less than the non-tapered multipath inductor (trace 154). Thus, as was previously the case, the tapered multipath inductors are capable of providing high accuracy operation across a variety of applications or usages, including when deployed into thermally-demanding environments characterized by inductor operation over large temperature ranges. Finally, it may be appreciated by comparing the example tapered multipath inductors in FIGS. 6 and 7 to the example tapered multipath inductor in FIGS. 4 and 5 that a tradeoff is encountered. In the "thick metal" version of the tapered multipath inductor plotted in FIGS. 4 and 5 in which the inductor spiral pattern is composed of lower electrical resistance Cu features deposited to a greater thickness, higher Q-factors are achieved, but with the tradeoff of increased (while still remaining relatively low) TCL values. Comparatively, in the "thin metal" versions of the tapered multipath inductor plotted in FIGS. 6 and 7 wherein the inductor spiral patterns are composed of higher electrical resistance Al features deposited to a lesser thickness, exceptionally low (near zero) TCL values and cost savings are achieved, with the tradeoff of decreased (but still relatively high) Q-factor values. Manufacturers are thus afforded with significant design freedom in varying the Q-factor and TCL values (and thus temperature sensitivity) of a particular tapered multipath inductor by selecting between the two structural configurations or builds set-forth above; by an intermediate or blended structural configuration; or by otherwise adjusting the pertinent dimensions (central opening dimension, track widths, parallel track spacing, winding-to-winding spacing), track composition, path count, and layout of the tapered multipath inductor in a desired manner.

As should be appreciated from the foregoing description, embodiments of the tapered multipath inductor are capable of providing both Q-factor values and low TCL values over targeted operational frequency range, such as low GHz frequencies. Additionally, embodiments of the tapered multipath inductor may have reduced inductor resistance temperature coefficients (TCR values) than comparable tapered single path inductors. In many applications, the ability of an inductor contained in an LC oscillator to provide high accuracy operation over such a broad temperature range may be inconsequential. However, in certain applications, such as applications in the automotive environments, the ability to maintain high accuracy LC oscillator operation over broad temperature ranges approaching or exceeding 200° C. through the incorporation of the presently-disclosed tapered multipath inductors may be highly desirable. For this reason, embodiments of the presently-disclosed tapered multipath inductor are further discussed below in the context of certain LC oscillators incorporated into larger microelectronic systems or circuits (e.g., frequency generators/clock systems or PLL systems) potentially deployed into thermally-demanding environments having highly variable temperatures. The following examples notwithstanding, embodiments of the tapered multipath inductor can be incorporated into circuit structures other than LC oscillators and are not restricted to any particular application or usage. The following description is thus set-forth by way of non-limiting example only with the metes and bounds of the instant invention solely defined by the appended claims.

Figure 8:
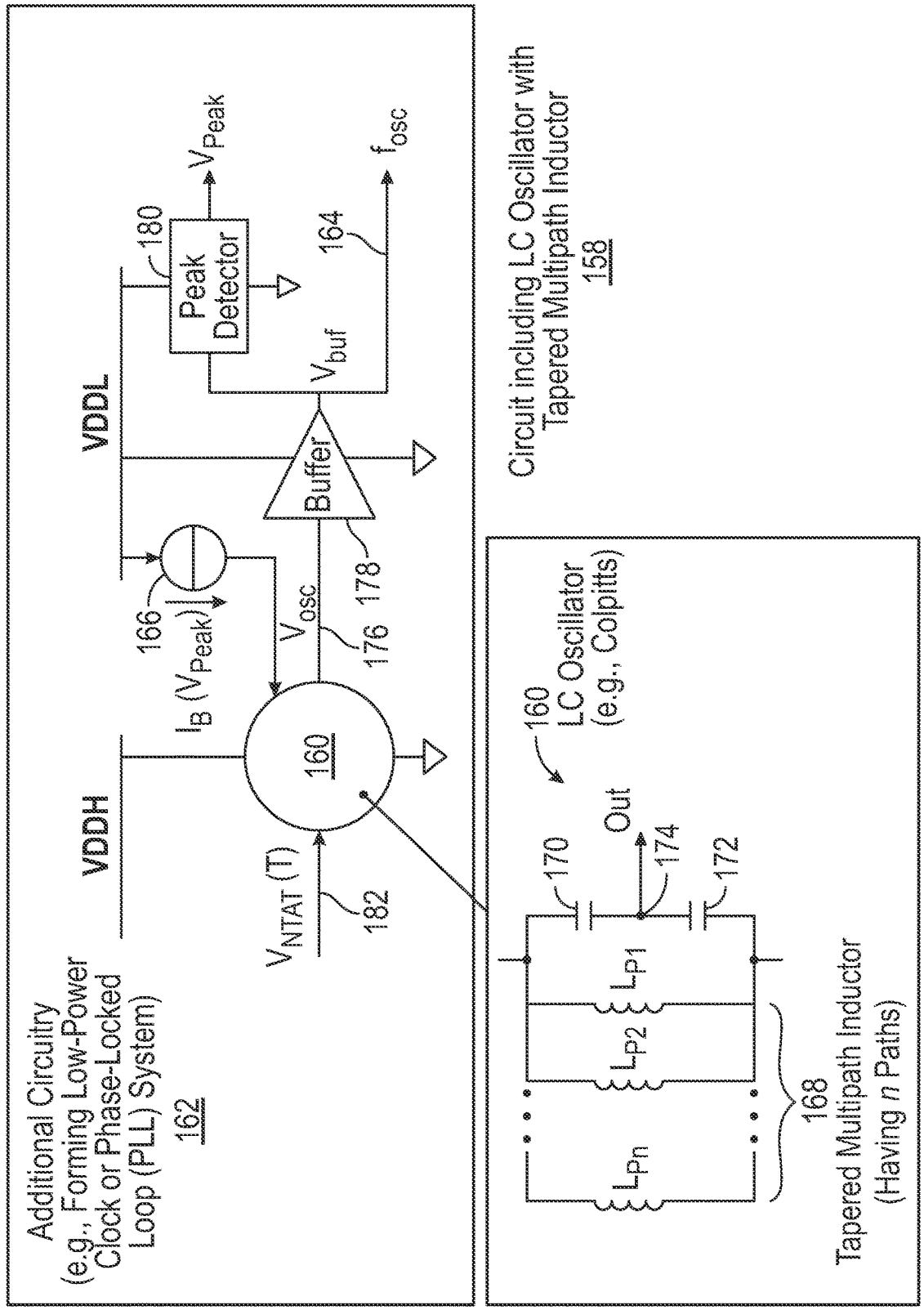
FIG. 8 is a generalized schematic of a microelectronic system (e.g., a low power clock system) including an inductor-capacitor (LC) oscillator circuit, a tapered multipath inductor contained in the LC oscillator circuit, and other on-chip or off-chip circuitry, as illustrated in accordance with an example embodiment.

Referring lastly to FIG. 8, a circuit schematic and block diagram is presented of a microelectronic system or circuit 158 incorporating an LC oscillator 160 in combination with additional circuitry 162, as illustrated in accordance with an example embodiment of the present disclosure. In this particular example, LC oscillator 160 and circuitry 162 combine to form a frequency source configured to output a frequency signal 164, which may be utilized to generate a clock signal or for timing purposes within a PLL system. A generalized version of circuit 158 and LC oscillator 160 are shown in FIG. 8, with additional description of this and other suitable applications for incorporation of the presently-disclosed tapered multipath inductor provided by U.S. Pat. No. 11,018,625 B1 issued May 25, 2021, and entitled "Frequency Reference Generator." During operation of circuit 158, a current source 166 generates a bias current (IB) applied to LC oscillator 160. In this example, and as indicated in a simplified format in a lower portion of FIG. 8, LC oscillator 160 may have a Colpitts architecture such that the inductor 168 is electrically coupled in parallel with two capacitors 170, 172 positioned on either side of an output node 174. In accordance with the present teachings, LC oscillator 160 includes a multipath tapered inductor (e.g., any described embodiment of inductors 22, 92), which is illustrated in a simplified form lacking, for example, symbology representative of mutual coupling. When driven by a non-illustrated active circuitry, LC oscillator 160 generates an oscillator signal 176, which is applied to an input of buffer 178. The output of buffer 178 is then divided between a peak detector 180 and an output 164 of the oscillator circuit 158. Output 164 may be utilized to provide a clock signal or in the context of a PLL system, as previously discussed. Through the incorporation of LC oscillator 160, a high accuracy output 164 can be generated even over large temperature disparities; e.g., operational temperature ranging from about −40° C. to about 175° C. in embodiments. Additionally, the circuit structure shown in FIG. 8 can potentially be implemented on a single die or semiconductor substrate, such as semiconductor substrate 30 shown in FIG. 1, noting that LC oscillator 160 may occupy a significantly smaller total area and volume due to the inclusion of tapered multipath inductor 168 as opposed to a more bulky and costly crystal-based oscillator.

CONCLUSION

There has thus been described tapered multipath inductors capable of providing both high Q-factor values and low TCLs over targeted operational frequency ranges, including over low GHz ranges (e.g., ranges between about 1 to about 3 GHz). When integrated into a high accuracy LC oscillator circuits, embodiments of the presently-disclosed tapered multipath inductors may favorably reduce the on-die footprint of the oscillator, minimize oscillator power consumption, or provide both such benefits, while optimizing RF performance including when deployed into thermally-demanding (e.g., high temperature range) operating environments. As a still further benefit, embodiments of the tapered multipath inductor are readily fabricated utilizing existing manufacturing approaches or techniques, including CMOS fabrication techniques, to enable integration of the tapered multipath inductor into circuit designs or IC die layouts with minimal cost and modification to existing fabrication flows.

Embodiments of a tapered multipath inductor have been provided, with such a tapered multipath inductor suitably formed as part of an IC die, on a PCB, or over another substrate. In embodiments, the tapered multipath inductor includes an inductor input terminal, an inductor output terminal, and N number of parallel inductor tracks (N≥2) electrically coupled between the inductor input terminal and the inductor output terminal. The parallel inductor tracks wrap around an inductor centerline to define a plurality of multipath inductor windings including an innermost winding and an outermost winding. The parallel inductor tracks vary (e.g., decrease) in inductor track width in a predetermined manner when progressing from the outermost winding to the innermost winding of the plurality of multipath inductor windings. In at least some implementations, the parallel inductor tracks have: (i) a first inductor track width, as measured along an axis perpendicular to the inductor centerline at a location intersecting the outermost winding; and (ii) a second inductor track width, as measured along the axis perpendicular to the inductor centerline at a location intersecting the innermost winding the second inductor track width differing from the first inductor track width by a factor of at least two. In such implementations, the second inductor track width may be less than half the first inductor track width. Additionally, the central opening or keep-out region of the tapered multipath inductor may be between 5 and 50 times the second inductor track width.

Embodiments of IC dies having integrated tapered multipath inductors have further been provided. In an embodiment, an IC die includes a semiconductor substrate, patterned metal layers compiled over the semiconductor substrate, and a tapered multipath inductor formed in the patterned metal layers. The tapered multipath inductor includes, in turn, an inductor input terminal, an inductor output terminal, and N number of parallel inductor tracks electrically coupled between the inductor input terminal and the inductor output terminal. The parallel inductor tracks wind or wrap around an inductor centerline to define a plurality of multipath inductor windings including an innermost winding and an outermost winding. The parallel inductor tracks vary (e.g., decrease) in track width when progressing from the outermost winding to the innermost winding of the plurality of multipath inductor windings.

LC oscillator circuits have also been disclosed. In an embodiment, the LC oscillator circuit includes a capacitor and a tapered multipath inductor electrically coupled to a terminal of the capacitor. The tapered multipath inductor includes, in turn, an inductor input terminal, an inductor output terminal, and N number of parallel inductor tracks electrically coupled between the inductor input terminal and the inductor output terminal. The parallel inductor tracks wind or wrap around an inductor centerline to define a plurality of multipath inductor windings including an innermost winding and an outermost winding. The parallel inductor tracks vary (e.g., decrease) in track width when progressing from the outermost winding to the innermost winding of the plurality of multipath inductor windings.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of embodiments of the tapered multipath inductor in any way. Rather, the foregoing Detailed Description will provide those skilled in the art with a convenient road map for implementing an example embodiment of embodiments of the tapered multipath inductor, it being understood that various changes may be made in the function and arrangement of elements described in an example embodiment without departing from the scope of embodiments of the tapered multipath inductor as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A tapered multipath inductor, comprising:
   an inductor input terminal;
   an inductor output terminal;
   N number of parallel inductor tracks electrically coupled between the inductor input terminal and the inductor output terminal, the parallel inductor tracks wrapping around an inductor centerline to define a plurality of multipath inductor windings including an innermost winding and an outermost winding; and
   cross-tracks formed in patterned metal layers, extending under or over the plurality of multipath inductor windings, and electrically coupling inner terminals ends of the parallel inductor tracks to the inductor input terminal and to the inductor output terminal,
   wherein the cross-tracks and the plurality of multipath inductor windings are composed of different metals,
   wherein N>2, and
   wherein the parallel inductor tracks vary in inductor track width in a predetermined manner when progressing from the outermost winding to the innermost winding of the plurality of multipath inductor windings.

2. The tapered multipath inductor of claim 1, wherein the parallel inductor tracks comprise:
   a first inductor track width, as measured along an axis perpendicular to the inductor centerline at a location intersecting the outermost winding; and
   a second inductor track width, as measured along the axis perpendicular to the inductor centerline at a location intersecting the innermost winding, the second inductor track width differing from the first inductor track width by a factor of at least two.

3. The tapered multipath inductor of claim 2, wherein the second inductor track width is less than half the first inductor track width.

4. The tapered multipath inductor of claim 2, wherein the tapered multipath inductor further comprises a central keep-out region surrounded by the innermost winding and having a keep-out region width further measured along the axis perpendicular to the inductor centerline; and
   wherein the keep-out region width is between 5 and 50 times the second inductor track width.

5. The tapered multipath inductor of claim 2, wherein the tapered multipath inductor further comprises an intermediate winding between the outermost winding and the innermost winding; and wherein the parallel inductor tracks further have a third inductor track width, as measured along the axis perpendicular to the inductor centerline at a location intersecting the intermediate winding.

6. The tapered multipath inductor of claim 5, wherein the third inductor track width is less than the first inductor track width and greater than the second inductor track width.

7. The tapered multipath inductor of claim 1, wherein the cross-tracks have widths greater than an average inductor track width of the innermost winding.

8. The tapered multipath inductor of claim 1, wherein tapered multipath inductor further comprises:
   a parallel track spacing between the parallel inductor tracks, as measured in a plane orthogonal to the inductor centerline; and
   a winding-to-winding spacing between the plurality of multipath inductor windings, as measured in the plane orthogonal to the inductor centerline;
   wherein at least one of the parallel track spacing and the winding-to-winding spacing varies in a predetermined manner when progressing from the outermost winding to the innermost winding of the plurality of multipath inductor windings.

9. A tapered multipath inductor, comprising:
   an inductor input terminal;
   an inductor output terminal; and
   N number of parallel inductor tracks electrically coupled between the inductor input terminal and the inductor output terminal, the parallel inductor tracks wrapping around an inductor centerline to define a plurality of multipath inductor windings including an innermost winding and an outermost winding;
   a parallel track spacing between the parallel inductor tracks, as measured in a plane orthogonal to the inductor centerline; and
   a winding-to-winding spacing between the plurality of multipath inductor windings, as measured in the plane orthogonal to the inductor centerline;
   wherein at least one of the parallel track spacing and the winding-to-winding spacing varies in a predetermined manner when progressing from the outermost winding to the innermost winding of the plurality of multipath inductor windings,
   wherein N>2, and
   wherein the parallel inductor tracks vary in inductor track width in a predetermined manner when progressing from the outermost winding to the innermost winding of the plurality of multipath inductor windings, and
   wherein the parallel track spacing and the winding-to-winding spacing increase, while the inductor track width decreases when progressing from the outermost winding to the innermost winding of the plurality of multipath inductor windings.

10. The tapered multipath inductor of claim 9, wherein the parallel inductor tracks decrease in inductor track width when progressing from the outermost winding to the innermost winding of the plurality of multipath inductor windings.

11. The tapered multipath inductor of claim 9, wherein the parallel inductor tracks comprise:
    a first inductor track decreasing in inductor track width at a first location as the parallel inductor tracks progress from the outermost winding to the innermost winding; and
    a second inductor track decreasing in inductor track width at a second location as the parallel inductor tracks progress from the outermost winding to the innermost winding, the second location diametrically opposite the first location taken about inductor centerline.

12. The tapered multipath inductor of claim 9, further comprising:
    an IC die that comprises radio frequency circuitry configured to operate over an operational frequency range; and
    wherein the tapered multipath inductor has an inductance temperature coefficient less than 40 parts per million per degree Celsius over the operational frequency range.

13. The tapered multipath inductor of claim 12, wherein the tapered multipath inductor has a quality factor greater than 10 over the operational frequency range.

14. The tapered multipath inductor of claim 12, wherein the plurality of multipath inductor windings are predominately composed of aluminum, by weight; and
    wherein the tapered multipath inductor has an inductance temperature coefficient less than 20 parts per million per degree Celsius over the operational frequency range.

15. The tapered multipath inductor of claim 9, further comprising an inductor-capacitor (LC) oscillator formed on a semiconductor substrate and containing the tapered multipath inductor.

16. The tapered multipath inductor of claim 15, further comprising a circuit containing the LC oscillator, the circuit comprising one of a clock system and a phase-locked loop circuit.

17. An integrated circuit (IC) die, comprising:
    a semiconductor substrate;
    patterned metal layers compiled over the semiconductor substrate; and
    a tapered multipath inductor formed in the patterned metal layers, the tapered multipath inductor comprising:
    an inductor input terminal;
    an inductor output terminal; and
    N number of parallel inductor tracks electrically coupled between the inductor input terminal and the inductor output terminal, the parallel inductor tracks wrapping around an inductor centerline to define a plurality of multipath inductor windings including an innermost winding and an outermost winding;
    a parallel track spacing between the parallel inductor tracks, as measured in a plane orthogonal to the inductor centerline; and
    a winding-to-winding spacing between the plurality of multipath inductor windings, as measured in the plane orthogonal to the inductor centerline;
    wherein at least one of the parallel track spacing and the winding-to-winding spacing varies in a predetermined manner when progressing from the outermost winding to the innermost winding of the plurality of multipath inductor windings,
    wherein N≥2,
    wherein the parallel inductor tracks vary in inductor track width in a predetermined manner when progressing from the outermost winding to the innermost winding of the plurality of multipath inductor windings, and
    wherein the parallel track spacing and the winding-to-winding spacing increase, while the inductor track width decreases when progressing from the outermost winding to the innermost winding of the plurality of multipath inductor windings.

18. An inductor-capacitor (LC) oscillator circuit, comprising:
    a capacitor; and a tapered multipath inductor electrically coupled to the capacitor, the tapered multipath inductor comprising:

an inductor input terminal;

an inductor output terminal; and

N number of parallel inductor tracks electrically coupled between the inductor input terminal and the inductor output terminal, the parallel inductor tracks wrapping around an inductor centerline to define a plurality of multipath inductor windings including an innermost winding and an outermost winding;

a parallel track spacing between the parallel inductor tracks, as measured in a plane orthogonal to the inductor centerline; and a winding-to-winding spacing between the plurality of multipath inductor windings, as measured in the plane orthogonal to the inductor centerline;

wherein at least one of the parallel track spacing and the winding-to-winding spacing varies in a predetermined manner when progressing from the outermost winding to the innermost winding of the plurality of multipath inductor windings, wherein $N \geq 2$, wherein the parallel inductor tracks vary in inductor track width in a predetermined manner when progressing from the outermost winding to the innermost winding of the plurality of multipath inductor windings, and wherein the parallel track spacing and the winding-to-winding spacing increase, while the inductor track width decreases when progressing from the outermost winding to the innermost winding of the plurality of multipath inductor windings.

\* \* \* \* \*